(12) United States Patent
Zhao et al.

(10) Patent No.: US 11,162,532 B2
(45) Date of Patent: Nov. 2, 2021

(54) MAGNETIC ROLLING BEARING CAPABLE OF REDUCING BALANCE RADIAL FORCE OF GEAR PUMP, AND ITS LIFE CALCULATION METHOD

(71) Applicant: Yanshan University, Qinhuangdao (CN)

(72) Inventors: Jianhua Zhao, Qinhuangdao (CN); Yongqiang Wang, Qinhuangdao (CN); Ziqi Wang, Qinhuangdao (CN); Dianrong Gao, Qinhuangdao (CN)

(73) Assignee: Yanshan University, Qinhuangdao (CN)

( * ) Notice: Subject to any disclaimer, the term of this patent is extended or adjusted under 35 U.S.C. 154(b) by 0 days.

(21) Appl. No.: 17/105,758

(22) Filed: Nov. 27, 2020

(65) Prior Publication Data

US 2021/0215197 A1    Jul. 15, 2021

(30) Foreign Application Priority Data

Jan. 14, 2020    (CN) .......................... 202010038353.6

(51) Int. Cl.
*F16C 39/06*    (2006.01)
*F16C 33/38*    (2006.01)
*F16C 19/06*    (2006.01)
*G01R 33/038*    (2006.01)

(52) U.S. Cl.
CPC .......... *F16C 33/3806* (2013.01); *F16C 19/06* (2013.01); *F16C 39/066* (2013.01); *G01R 33/0385* (2013.01)

(58) Field of Classification Search
CPC .. F16C 19/06; F16C 32/0423; F16C 32/0425; F16C 32/0427; F16C 32/0429; F16C 33/3806; F16C 33/60; F16C 39/06; F16C 39/063; F16C 39/066; F04C 2/08; F04C 2/084; G01R 33/0385

See application file for complete search history.

(56) References Cited

U.S. PATENT DOCUMENTS 3,011,842 A * 12/1961 Norris ..................... F16C 33/37
   384/446
2003/0223667 A1* 12/2003 Leibowitz ............... F16C 19/40
   384/574

FOREIGN PATENT DOCUMENTS

CN      103758869 A  *  4/2014  ............ F16C 33/62
DE  202018005594 U1  *  1/2019  ............ F16C 39/06

* cited by examiner

*Primary Examiner* — Phillip A Johnson
(74) *Attorney, Agent, or Firm* — IPro, PLLC

(57) ABSTRACT

The present invention discloses a magnetic rolling bearing capable of reducing the balance radial force of the gear pump, which includes a magnetized inner ring, a rolling body, a cage, and a magnetized outer ring assembly. The inner ring is magnetized to make the inner and outer ring surfaces of the magnetized inner ring have different magnetic properties; the magnetized outer ring assembly consists of four components, namely an upper ring surface of the magnetized outer ring assembly, a lower ring surface of the magnetized outer ring assembly, and two components in left and right. The left and right components are not magnetized, they are connected by recesses and are fixed with bolts, and the four components are alternately connected to form a complete ring.

4 Claims, 4 Drawing Sheets

MAGNETIC ROLLING BEARING CAPABLE OF REDUCING BALANCE RADIAL FORCE OF GEAR PUMP, AND ITS LIFE CALCULATION METHOD

TECHNICAL FIELD

The present invention relates to a rolling bearing, and in particular, to a magnetic rolling bearing capable of reducing a balance radial force of a gear pump, and a life calculation method thereof.

BACKGROUND

As an important component of the hydraulic system, an external gear pump uses the volume change of a closed volume cavity between two external gears and an inner wall of an oil pump to achieve suction and discharge of oil. The external gear pump has a series of advantages such as simple structure, small size and quality, convenient manufacturing, strong self-priming ability, and insensitivity to oil pollution, but there is also a problem that the radial unbalance force makes the bearings of the external gear pump wear more serious. Therefore, the present invention is modified in structure, and researched and developed a rolling permanent magnet composite bearing that can reduce the radial unbalance force on the bearing rolling body.

SUMMARY

The technical problem to be solved by the present invention is to provide a magnetic rolling bearing capable of reducing the balance radial force of the gear pump and a life calculation method, which combines common rolling bearing and permanent magnetic bearing, and modifies the bearing structure. The inner and outer rings of the bearing are magnetized so that the inner and outer side surfaces of the inner ring of the bearing have different magnetic properties. The outer ring assembly of the bearing consists of four components, two magnetized components and two non-magnetized components. The four components are connected and fixed by slots and bolts. When the external gear pump is in operation, the rolling body of the bearing is used as the main forced device, and the magnetic force generated between the inner and outer rings of the bearing is used as an auxiliary to reduce the radial force of the gear pump on the bearing rolling body, to reduce the wear of bearing roller due to friction and extrusion, and to increase the life of the bearing. At the same time, the structure is modified, and the outer ring is designed as an assembly to facilitate its installation and the magnetization process of the outer ring.

To solve the above technical problems, the present invention adopts the following technical measures.

The present invention provides a magnetic rolling bearing capable of reducing a balance radial force of a gear pump, wherein the magnetic rolling bearing comprises: a magnetized inner ring, a magnetized outer ring, a rolling body and a cage, the rolling body is provided outside the magnetized inner ring, the magnetized outer ring is provided at an outer side of the magnetized inner ring, the rolling body is mounted by means of the cage;

the magnetized inner ring is in an annular shape, and a magnetic property of an inner surface of the magnetized inner ring that is in contact with a shaft is opposite to a magnetic property of an outer surface of the magnetized inner ring that is in contact with the rolling body;

the magnetized outer ring comprises a first magnetized component, a second magnetized component, a first non-magnetized component and a second non-magnetized component, the first magnetized component and the second magnetized component are provided oppositely, the first non-magnetized component and the second non-magnetized component are provided oppositely; the first magnetized component, the first non-magnetized component, the second magnetized component and the second non-magnetized component are combined end to end to form the magnetized outer ring of an annular shape, two ends of each of the first magnetized component and the second magnetized component are respectively provided with a protrusion, and two ends of each of the first non-magnetized component and the second non-magnetized component are respectively provided with a recess that matches with the protrusion, the ends of the first magnetized component, the second magnetized component, the first non-magnetized component and the second non-magnetized component are respectively provided with a boss, the boss is provided with a bolt hole, the first magnetized component, the second magnetized component, the first non-magnetized component and the second non-magnetized component are connected to each other by the protrusions and recesses, and then are further fixed by means of passing mounting components through the mounting holes;

magnetic properties of the first magnetized component and the second magnetized component are opposite, that is, magnetic properties of an inner ring of the first magnetized component and an outer surface of the magnetized inner ring are opposite, and magnetic properties of an inner ring of the second magnetized component and the outer surface of the magnetized inner ring are the same;

during an installation process, three of the first magnetized component, the second magnetized component, the first non-magnetized component and the second non-magnetized component of the magnetized outer ring are assembled together to form an incomplete outer ring, and then the rolling body and the cage are installed between the inner ring of the bearing and the incomplete outer ring, and the remaining assembly of the magnetized outer ring is installed after the rolling body and the mounting cage are installed;

in response that the bearing is installed on the gear pump, the first magnetized component is installed in a high-pressure oil area of the gear pump, and the second magnetized component is installed in a low-pressure oil area of the gear pump, so that a suction force between the outer surface of the magnetized inner ring and the first magnetized component of the magnetized outer ring and a repulsion force between the magnetized inner ring and the second magnetized component of the outer ring are used to reduce a radial unbalance force on a portion of the rolling body of the bearing from the high-pressure oil area to the low-pressure oil area of the external gear pump.

Preferably, the mounting member is a bolt, and the mounting hole is a bolt hole.

Preferably, in response that the gear pump is in operation, the magnetized inner ring is in a middle position; in response that the gear pump is not in operation, the radial unbalanced force generated by a pressure difference in a suction and discharge area acts on the main shaft to cause the main shaft to deviate, so that a distance between the magnetized inner ring and the magnetized outer ring of the rolling bearing on the main shaft changes, a magnetic repulsion force between the magnetized inner ring and the lower ring surface of the magnetized outer ring increases, and the increased magnetic repulsion force can balance or offset the radial unbalance force on a part of the shaft.

Preferably, the present invention further provides a life calculation method of a rolling bearing based on the above-mentioned magnetic rolling bearing capable of reducing the balance radial force of the gear pump, and the method includes the following steps of:

S1, calculating a magnetic force between the inner and outer rings of the bearing, which includes the following sub-steps of:

S11, determining the magnetic force acting on a magnetic particle by a potential energy obtained during magnetization, wherein the potential energy is obtained by the following formula:

$$U = -\int_V \frac{\mu_0 \kappa H^2}{2} dV$$

in which, $\mu_0$ is a magnetic permeability in vacuum, $\kappa$ is a volume susceptibility of medium, and dV is a volume element of the particle;

S12, according to the laws of mechanics, expressing the magnetic force acting on the magnetic particle by a negative gradient value of the potential energy of the particle, $$F_M = -gradU = grad\int_V \frac{\mu_0 \kappa H^2}{2} dV;$$

S13, in response that the particle size is not large, assuming that volume magnetic susceptibility of the particle is a constant in the range of an occupied volume, and HgradH in the occupied volume is also an approximately constant, the magnetic force of the magnetic particle is expressed as:

$F_M = \mu_0 \kappa V H gradH,$

S14, eliminating, by using the concept of specific magnetic force, an influence of actual voids in mineral particles on a calculation of the magnetic force, to obtain a calculation formula of the magnetic force expressed as:

$$f_M = \frac{F_M}{m} = \frac{\mu_0 \kappa H gradH}{\delta V} = \mu_0 \chi H gradH$$

in which, in is a mass of the particle in Kg, $\delta$ is a density of the particle in Kg/m$^3$, $\chi$ is a specific magnetic susceptibility of the particles in m$^3$/kg;

S15, integrating the magnetic force acting on each magnetic particle to obtain the magnetic force acting between the inner and outer rings;

S2, calculating the life of the rolling bearing, which includes the following sub-steps of:

S21, calculating the radial unbalance force on the external gear pump, wherein the radial unbalance force on the external gear pump is expressed as:

$P_R = F_R - f_M$ in which, $F_R$ represents the radial unbalanced force of the external gear pump, for a driving wheel, $F_R = F_1$; and for a driven wheel, the radial force $F_R = F_2$;

wherein, a calculation formula of a resultant force on the driving wheel bearing and a resultant force on the driven wheel bearing is expressed as:

$F_1 = 0.75 \Delta p b d_a$ $F_2 = 0.85 \Delta p b d_a$ in which, $F_1$ represents the resultant force acting on the drive wheel bearing, in N;

$F_2$ represents the resultant force acting on the driven wheel bearing, in N;

$\Delta p$ represents a pressure difference between an outlet and an inlet of the gear pump, in Pa;

b represents a tooth width of the gear pump, in in;

$d_a$ represents a diameter of an addendum circle of the gear pump, in m;

S22, calculating an equivalent dynamic load on the rolling bearing, the equivalent dynamic load on the rolling bearing being expressed as:

$$P\sqrt{=P_r^2 + P^2 a}$$

in which, $P_r$ represents a radial force on the rolling bearing, $P_a$ represents an axial force on the rolling bearing;

S23, calculating the life of the rolling bearing, the life calculation formula of the rolling bearings being expressed as:

$$L_h = \frac{10^6}{60n}\left(\frac{C}{P}\right)^\varepsilon$$

in which, $L_h$ represents a rated life of the rolling bearing, in hours;

n represents a working speed of the rolling bearing, in r/min;

C represents a basic rated dynamic load of the rolling bearing, in N;

P represents an equivalent rated dynamic load of the rolling bearing, in N;

$\varepsilon$ represents a calculation coefficient of the bearing, for the rolling bearing, $\varepsilon = 10/3$.

Compared with the prior art, the present invention has the following beneficial effects.

First, the present invention magnetizes the inner and outer rings of the rolling bearing, so that the inner and outer rings of the bearing are magnetic. The magnetic force can reduce the radial unbalance force of the external gear pump on the rolling body of the bearing, and reduce the excessive wear of bearing roller due to pressure, and to increase the life of the bearing. At the same time, the structure is modified, and the outer ring is designed as an assembly to facilitate its installation and the magnetization process of the outer ring. At the same time, the outer ring is designed in the form of an assembly, which simplifies the combined installation process of the bearing and facilitates the magnetization process of the outer ring assembly.

Second, compared with a simple rolling bearing and a simple permanent magnetic bearing, the present invention combines a simple rolling bearing and a simple permanent magnetic bearing to design a rolling permanent magnetic composite bearing that combines rolling and permanent magnets. The composite bearing has the advantages of both simple structure of the rolling bearing and easy installation and maintenance and good interchangeability. At the same time, it combines the frictionless advantages of permanent magnetic bearings to a certain extent. The rolling body of the bearing is the main forced device, and the magnetic force is the auxiliary device. Deformation of the inner ring of the bearing causes the change of the magnetic forces between the inner and outer rings, and the magnetic force is used to reduce the pressure on a part of the rolling body of the bearing. The magnetic force between the inner and outer rings of the composite bearing counteracts or balances a part of the radial unbalanced force of the gear pump, which improves the life of the rolling body of the bearing. At the same time, the present invention makes the outer ring of the rolling bearing into the form of an assembly. The outer ring consists of four components to form an outer ring assembly instead of a single outer ring. This is more conducive to the magnetization of the outer ring assembly and makes the magnetization more convenient. At the same time, the rolling permanent magnet composite bearing is more convenient to install. During the magnetization process, only two of the four outer ring assemblies are magnetized, and the other two are not magnetized. The magnetized components and the non-magnetized components are alternately connected, and the four outer ring assemblies are connected end to end through protrusions and recesses.

DETAILED DESCRIPTION OF EMBODIMENTS

Figure 1:
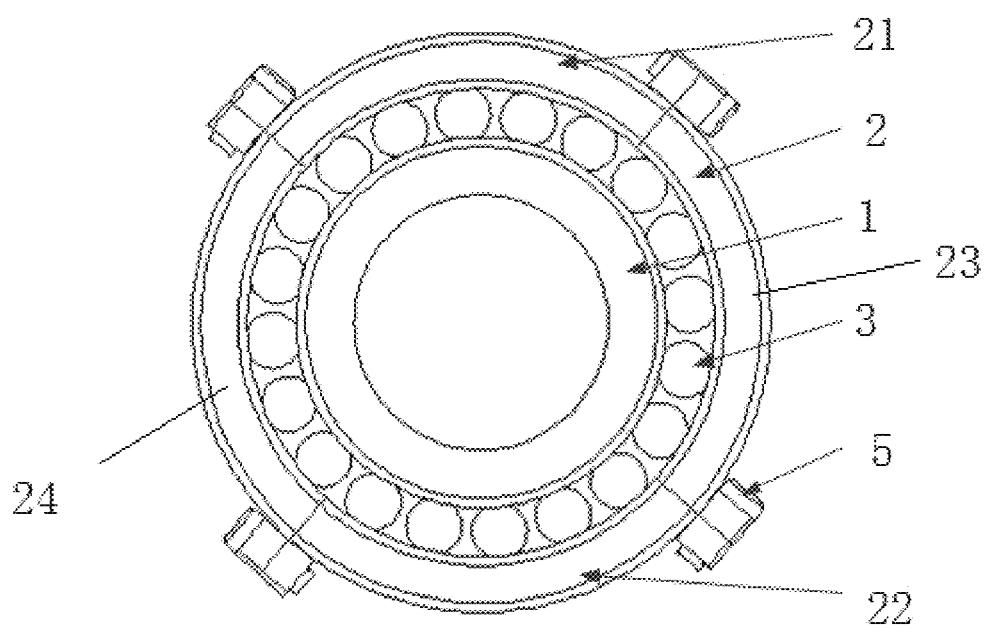
FIG. 1 is a structural schematic diagram of a magnetic rolling bearing capable of reducing a balance radial force of a gear pump according to the present invention.

Hereinafter, embodiments of the present invention will be described with reference to the drawings.

The present invention provides a magnetic rolling bearing capable of reducing a balance radial force of a gear pump, wherein the magnetic rolling bearing comprises: a magnetized inner ring 1, a magnetized outer ring 2, a rolling body 3 and a cage.

The magnetized inner ring 1 is in an annular shape, and a magnetic property of an inner surface of the magnetized inner ring 1 that is in contact with a shaft is opposite to a magnetic property of an outer surface of the magnetized inner ring 1 that is in contact with the rolling body 3.

The magnetized outer ring 2 comprises a first magnetized component 21, a second magnetized component 22, a first non-magnetized component 23 and a second non-magnetized component 24, the first magnetized component 21 and the second magnetized component 22 are provided oppositely, the first non-magnetized component 23 and the second non-magnetized component 24 are provided oppositely; the first magnetized component 21, the first non-magnetized component 23, the second magnetized component 22 and the second non-magnetized component 24 are combined end to end to form the magnetized outer ring of an annular shape, two ends of each of the first magnetized component 21 and the second magnetized component 22 are respectively provided with a protrusion, and two ends of each of the first non-magnetized component 23 and the second non-magnetized component 24 are respectively provided with a recess that matches with the protrusion. The ends of the first magnetized component 21, the second magnetized component 22, the first non-magnetized component 23 and the second non-magnetized component 24 are respectively provided with a boss, the boss is provided with a bolt hole, the first magnetized component 21, the second magnetized component 22, the first non-magnetized component 23 and the second non-magnetized component 24 are connected to each other by the protrusions and recesses, and then are further fixed by means of bolts.

Magnetic properties of the first magnetized component 21 and the second magnetized component 22 are opposite, that is, magnetic properties of an inner ring of the first magnetized component 21 and an outer surface of the magnetized inner ring 22 are opposite, and magnetic properties of an inner ring of the second magnetized component 22 and the outer surface of the magnetized inner ring are the same.

It can be seen from the calculation formula of the rolling bearing that the life of the bearing is inversely proportional to the equivalent rated dynamic load on the bearing. The greater the dynamic load on the bearing, the shorter its life. The rolling body of the bearing is the main forced part.

During an installation process of the bearing, three outer ring assemblies of the bearing are assembled together to form an incomplete outer ring, and then the rolling body and the cage are installed between the inner ring of the bearing and the incomplete outer ring, and the remaining assembly of the magnetized outer ring is installed after the rolling body and the mounting cage are installed.

When the bearing is installed on the gear pump, the first magnetized component 21 is installed in a high-pressure oil area of the gear pump, and the second magnetized component 22 is installed in a low-pressure oil area of the gear pump, so that a suction force between the outer surface of the magnetized inner ring and the first magnetized component 21 of the magnetized outer ring and a repulsion force between the magnetized inner ring and the second magnetized component 22 of the outer ring are used to reduce a radial unbalance force on a portion of the rolling body of the bearing from the high-pressure oil area to the low-pressure oil area of the external gear pump.

As shown in FIG. 1, the inner ring of the magnetic rolling bearing capable of reducing the balance radial force of the gear pump is similar to that of a common rolling bearing. It is magnetized so that the inner and outer ring surfaces of the inner ring have different magnetic properties. The inner ring surface has N pole magnetic property, and the outer ring surface of the inner ring has S pole magnetic property.

Figure 2:
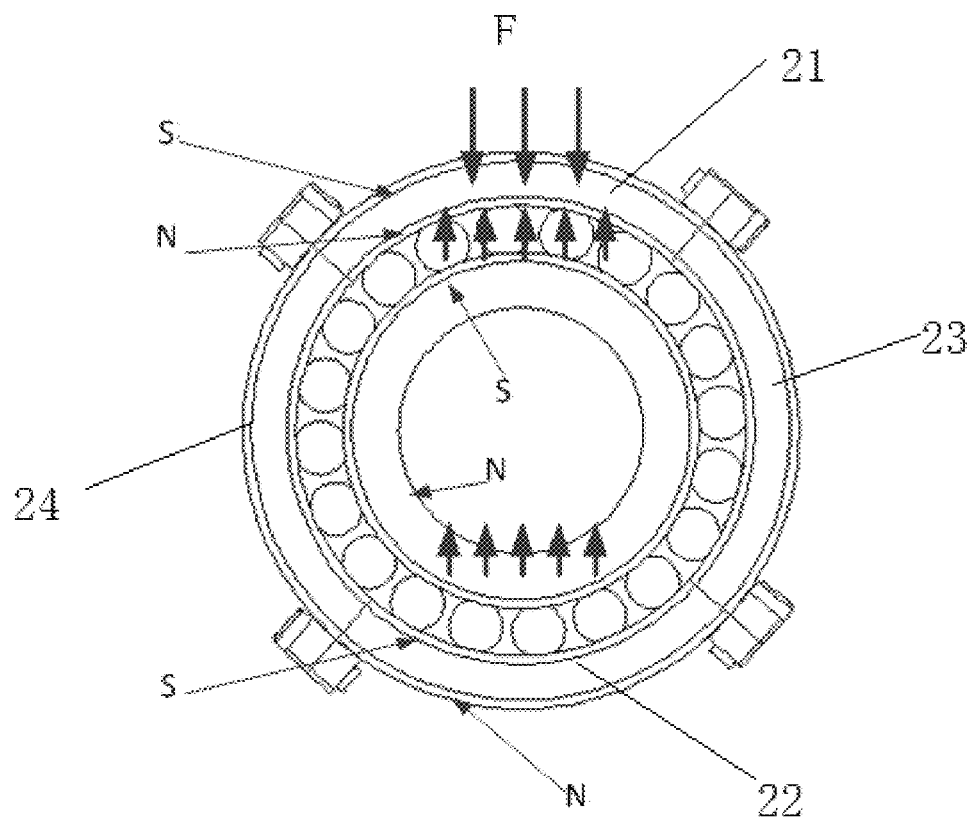
FIG. 2 is a schematic force diagram of the magnetic rolling bearing capable of reducing the balance radial force of the gear pump according to the present invention.
Figure 3:
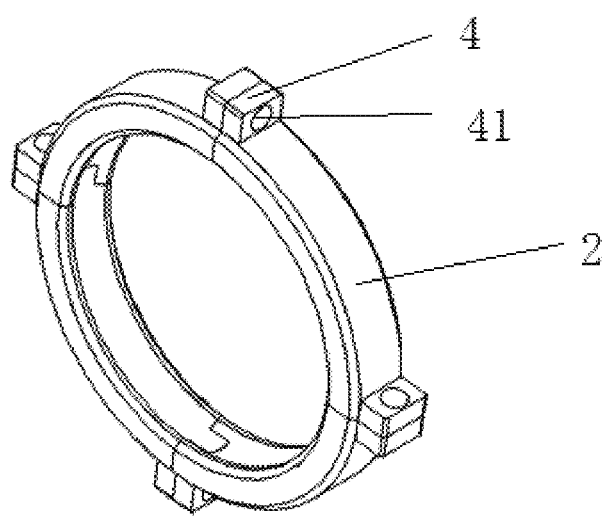
FIG. 3 is a schematic diagram of an outer ring assembly of the magnetic rolling bearing capable of reducing the balance radial force of the gear pump according to the present invention.

As shown in FIG. 2 and FIG. 3, in the magnetic rolling bearing capable of reducing the balance radial force of the gear pump, the outer ring assembly is divided into four components, two magnetized components and two non-magnetized components. They are all a quarter of a circle. The magnetized components are processed with protrusions, and the non-magnetized components are processed with corresponding recesses. The four components are connected and fixed by fittings of the protrusions and the recesses and positioning of the bolts 5.

Figure 4:
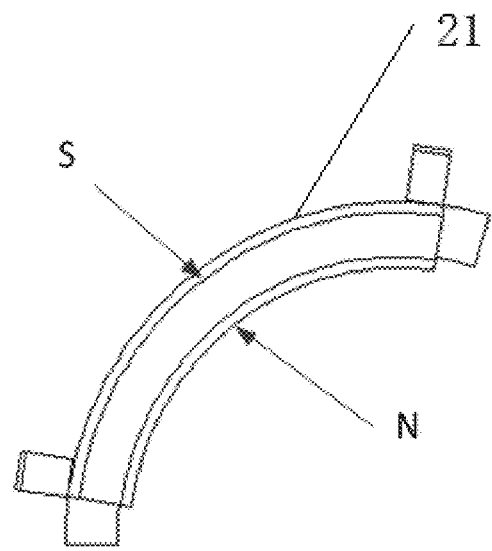
FIG. 4 is a schematic diagram of an outer ring magnetized part of the magnetic rolling bearing capable of reducing the balance radial force of the gear pump according to the present invention.
Figure 5:
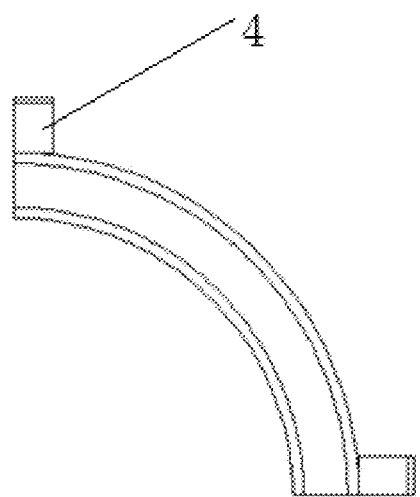
FIG. 5 is a schematic diagram of an outer ring non-magnetized part of the magnetic rolling bearing capable of reducing the balance radial force of the gear pump according to the present invention.
Figure 6:
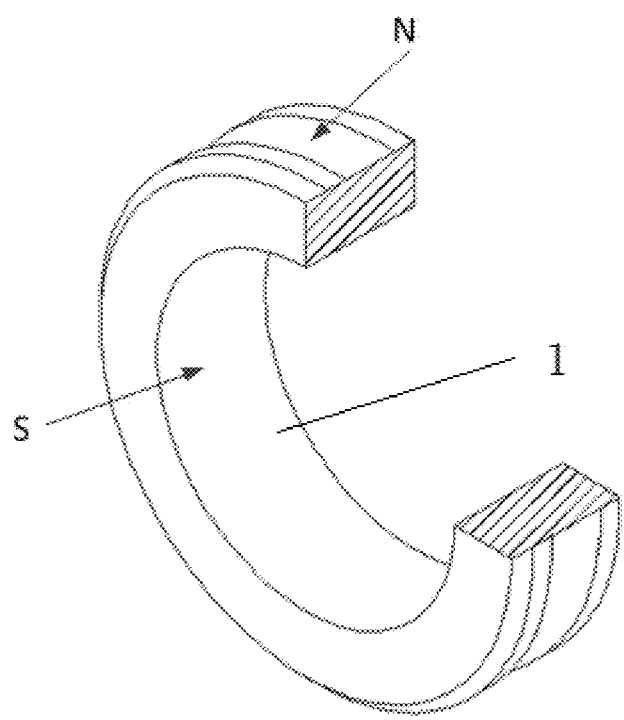
FIG. 6 is a schematic force diagram of the magnetic rolling bearing capable of reducing the balance radial force of the gear pump according to the present invention.

As shown in FIG. 4 and FIG. 5, when the external gear pump is in operation, due to the structure of the external gear pump, there will be a radial unbalance force from the high-pressure oil area to the low-pressure oil area of the oil pump, which will cause a certain amount of flexible deformation of the shaft, the roller of the bearing on the shaft will also be extruded due to the flexible deformation of the shaft, thereby accelerating wear and reducing the life of the bearing. Therefore, the magnetic rolling bearing capable of reducing the balance radial force of the gear pump is magnetized on the inner and outer rings, the magnetic suction force between the magnetized inner ring and the first magnetized component of the outer ring, and the magnetic repulsive force between the magnetized inner ring and the second magnetized component of the outer ring are used to reduce the radial unbalance force from the external gear pump on the rolling body of the bearing, so that the deformation of the bearing is reduced or even not happened when the gear pump is in operation, and the wear of bearing roller due to extrusion is reduced, and the life of the bearing is increased.

Preferably, the present invention further provides a life calculation method of a rolling bearing based on the above-mentioned magnetic rolling bearing capable of reducing the balance radial force of the gear pump, and the method includes the following steps of:

S1, calculating a magnetic force between the inner and outer rings of the bearing, which includes the following sub-steps of:

S11, determining the magnetic force acting on a magnetic particle by a potential energy obtained during magnetization, wherein the potential energy is obtained by the following formula:

$$U = -\int_V \frac{\mu_0 \kappa H^2}{2} dV$$

in which, $\mu_0$ is a magnetic permeability in vacuum, K is a volume susceptibility of medium, and dV is a volume element of the particle;

S12, according to the laws of mechanics, expressing the magnetic force acting on the magnetic particle by a negative gradient value of the potential energy of the particle, $$F_M = -\text{grad}U = \text{grad}\int_V \frac{\mu_0 \kappa H^2}{2} dV;$$

S13, in response that the particle size is not large, assuming that volume magnetic susceptibility of the particle is a constant in the range of an occupied volume, and HgradH in the occupied volume is also an approximately constant, the magnetic force of the magnetic particle is expressed as:

$F_M = \mu_0 \kappa V H \text{grad} H;$

S14, eliminating, by using the concept of specific magnetic force, an influence of actual voids in mineral particles on a calculation of the magnetic force, to obtain a calculation formula of the magnetic force expressed as:

$$f_M = \frac{F_M}{m} = \frac{\mu_0 \kappa H \text{grad} H}{\delta V} = \mu_0 \chi H \text{grad} H$$

in which, in is a mass of the particle in Kg, $\delta$ is a density of the particle in Kg/m³, $\chi$ is a specific magnetic susceptibility of the particles in m³/kg;

S15, integrating the magnetic force acting on each magnetic particle to obtain the magnetic force acting between the inner and outer rings;

S2, calculating the life of the rolling bearing, which includes the following sub-steps of:

S21, calculating the radial unbalance force on the external gear pump, wherein the radial unbalance force on the external gear pump is expressed as:

$P_R = F_R - f_M$ in which, $F_R$ represents the radial unbalanced force of the external gear pump, for a driving wheel, $F_R = F_1$; and for a driven wheel, the radial force $F_R = F_2$;

wherein, a calculation formula of a resultant force on the driving wheel bearing and a resultant force on the driven wheel bearing is expressed as:

$F_1 = 0.75 \Delta p b d_a$ $F_2 = 0.85 \Delta p b d_a$ in which, $F_1$ represents the resultant force acting on the drive wheel bearing, in N;

$F_2$ represents the resultant force acting on the driven wheel bearing, in N;

$\Delta p$ represents a pressure difference between an outlet and an inlet of the gear pump, in Pa;

b represents a tooth width of the gear pump, in in;

$d_a$ represents a diameter of an addendum circle of the gear pump, in m;

S22, calculating an equivalent dynamic load on the rolling bearing, the equivalent dynamic load on the rolling bearing being expressed as:

$P = \sqrt{P^2_r + P^2_a}$ in which, $P_r$ represents a radial force on the rolling bearing, $P_a$ represents an axial force on the rolling bearing;

S23, calculating the life of the rolling bearing, the life calculation formula of the rolling bearings being expressed as:

$$L_h = \frac{10^6}{60n}\left(\frac{C}{P}\right)^\varepsilon$$

in which, $L_h$ represents a rated life of the rolling bearing, in hours;

n represents a working speed of the rolling bearing, in r/min;

C represents a basic rated dynamic load of the rolling bearing, in N;

P represents an equivalent rated dynamic load of the rolling bearing, in N;

$\varepsilon$ represents a calculation coefficient of the bearing, for the rolling bearing, $\varepsilon = 10/3$.

The following embodiments further describe the magnetic rolling bearing capable of reducing the balance radial force of the gear pump of the present invention.

In modern hydraulic technology, due to its simple structure, gear pumps are not only widely used in hydraulic technology, but also widely used as lubrication pumps and infusion pumps in food and chemical processes. The following embodiments take a gear pump used in a small hydraulic pump station as an example.

When the gear pump is stationary and not in operation, the weight of the main shaft of the gear pump is transmitted to the housing via the bearing. When the main shaft of the gear pump is not heavy, it can be ignored; when the gear pump is in operation, there will be a high-pressure oil suction area and a low-pressure oil discharge area, the pressure difference between the suction and discharge areas will act on the main shaft to generate a radial unbalanced force, causing the main shaft to further press the rolling bearing, and the wear between the rolling body of the rolling bearing and the outer ring of the bearing will increase, thereby reducing the life of the rolling bearing.

After using this rolling permanent magnet composite bearing, when the gear pump is in operation, the magnetized inner ring is in a middle position; when the gear pump is not in operation, the radial unbalanced force generated by a pressure difference in a suction and discharge area acts on the main shaft to cause the main shaft to deviate, so that a distance between the magnetized inner ring and the magnetized outer ring of the rolling bearing on the main shaft changes, a magnetic repulsion force between the magnetized inner ring and the lower ring surface of the magnetized outer ring increases, and the increased magnetic repulsion force can balance or offset the radial unbalance force on a part of the shaft. As a result, it reduces the wear of the rolling body of the rolling permanent magnet composite bearing, thereby extending its life.

Compared with the prior art, the present invention has the following beneficial effects.

The present invention magnetizes the inner and outer rings of the rolling bearing, so that the inner and outer rings of the bearing are magnetic, and the magnetic force can be used to balance or offset a part of the radial unbalance force of the external gear pump. When the force is applied, the rolling body of the bearing is still the main forced device, and the magnetic force is only used as an auxiliary device, which reduces the excessive wear of the bearing rollers caused by external force extrusion and improves the life of the bearing. At the same time, the outer ring of the bearing is made into an outer ring assembly, which facilitates the magnetization of the outer ring of the bearing, and facilitates the combined installation of the rolling permanent magnet composite bearing.

The above-mentioned embodiments only describe the preferred embodiments of the present invention and do not limit the scope of the present invention. Without departing from the design spirits of the present invention, those of ordinary skill in the art have made various modifications and improvements to the technical solutions of the present invention. Such modifications and improvements shall fall within the protection scope determined by the claims of the present invention.

What is claimed is:

1. A magnetic rolling bearing capable of reducing a balance radial force of a gear pump, wherein the magnetic rolling bearing comprises: a magnetized inner ring, a magnetized outer ring, a rolling body and a cage, the rolling body is provided outside the magnetized inner ring, the magnetized outer ring is provided at an outer side of the magnetized inner ring, the rolling body is mounted by means of the cage;

the magnetized inner ring is in an annular shape, and a magnetic property of an inner surface of the magnetized inner ring that is in contact with a shaft is opposite to a magnetic property of an outer surface of the magnetized inner ring that is in contact with the rolling body;

the magnetized outer ring comprises a first magnetized component, a second magnetized component, a first non-magnetized component and a second non-magnetized component, the first magnetized component and the second magnetized component are provided oppositely, the first non-magnetized component and the second non-magnetized component are provided oppositely; the first magnetized component, the first non-magnetized component, the second magnetized component and the second non-magnetized component are combined end to end to form the magnetized outer ring of an annular shape, two ends of each of the first magnetized component and the second magnetized component are respectively provided with a protrusion, and two ends of each of the first non-magnetized component and the second non-magnetized component are respectively provided with a recess that matches with the protrusion, the ends of the first magnetized component, the second magnetized component, the first non-magnetized component and the second non-magnetized component are respectively provided with a boss, the boss is provided with a mounting hole, the first magnetized component, the second magnetized component, the first non-magnetized component and the second non-magnetized component are connected to each other by the protrusions and recesses, and then are further fixed by means of passing mounting components through the mounting holes;

magnetic properties of the first magnetized component and the second magnetized component are opposite, that is, magnetic properties of an inner ring of the first magnetized component and an outer surface of the magnetized inner ring are opposite, and magnetic properties of an inner ring of the second magnetized component and the outer surface of the magnetized inner ring are the same;

during an installation process, three of the first magnetized component, the second magnetized component, the first non-magnetized component and the second non-magnetized component of the magnetized outer ring are assembled together to form an incomplete magnetized outer ring, and then the rolling body and the cage are installed between the inner ring of the bearing and the incomplete outer ring, and the remaining assembly of the magnetized outer ring is installed after the rolling body and the mounting cage are installed;

in response that the bearing is installed on the gear pump, the first magnetized component is installed in a high-pressure oil area of the gear pump, and the second magnetized component is installed in a low-pressure oil area of the gear pump, so that a suction force between the outer surface of the magnetized inner ring and the first magnetized component of the magnetized outer ring and a repulsion force between the magnetized inner ring and the second magnetized component of the outer ring are used to reduce a radial unbalance force on a portion of the rolling body of the bearing from the high-pressure oil area to the low-pressure oil area of the external gear pump.

2. The magnetic rolling bearing capable of reducing the balance radial force of the gear pump according to claim 1, wherein the mounting member is a bolt, and the mounting hole is a bolt hole.

3. The magnetic rolling bearing capable of reducing the balance radial force of the gear pump according to claim 1, wherein in response that the gear pump is in operation, the magnetized inner ring is in a middle position; in response that the gear pump is not in operation, the radial unbalanced force generated by a pressure difference in a suction and discharge area acts on the main shaft to cause the main shaft to deviate, so that a distance between the magnetized inner ring and the magnetized outer ring of the rolling bearing on the main shaft changes, a magnetic repulsion force between the magnetized inner ring and the lower ring surface of the magnetized outer ring increases, and the increased magnetic repulsion force can balance or offset the radial unbalance force on a part of the shaft.

4. A life calculation method of a rolling bearing based on the magnetic rolling bearing capable of reducing the balance radial force of the gear pump according to claim 1, the method comprising the following steps of:

S1, calculating a magnetic force between the inner and outer rings of the bearing, which includes the following sub-steps of:

S11, determining the magnetic force acting on a magnetic particle by a potential energy obtained during magnetization, wherein the potential energy is obtained by the following formula:

$$U = -\int_V \frac{\mu_0 \kappa H^2}{2} dV$$

in which, $\mu_0$ is a magnetic permeability in vacuum, K is a volume susceptibility of medium, and dV is a volume element of the particle;

S12, according to the laws of mechanics, expressing the magnetic force acting on the magnetic particle by a negative gradient value of the potential energy of the particle, $$F_M = -gradU = grad \int_V \frac{\mu_0 \kappa H^2}{2} dV;$$

S13, in response that the particle size is not large, assuming that volume magnetic susceptibility of the particle is a constant in the range of an occupied volume, and HgradH in the occupied volume is also approximately constant, the magnetic force of the magnetic particle is expressed as:

$F_M = \mu_0 \kappa V HgradH;$

S14, eliminating, by using the concept of specific magnetic force, an influence of actual voids in mineral particles on a calculation of the magnetic force, to obtain a calculation formula of the magnetic force expressed as:

$$f_M = \frac{F_M}{m} = \frac{\mu_0 \kappa HgradH}{\delta V} = \mu_0 \chi HgradH$$

in which, m is a mass of the particle in Kg, $\delta$ is a density of the particle in Kg/m$^3$, $\chi$ is a specific magnetic susceptibility of the particles in m$^3$/kg;

S15, integrating the magnetic force acting on each magnetic particle to obtain the magnetic force acting between the magnetized inner and outer rings;

S2, calculating the life of the rolling bearing, which includes the following sub-steps of:

S21, calculating the radial unbalance force on the external gear pump, wherein the radial unbalance force on the external gear pump is expressed as:

$P_R = F_R - f_M$ in which, $F_R$ represents the radial unbalanced force of the external gear pump, for a driving wheel, $F_R = F_1$; and for a driven wheel, the radial force $F_R = F_2$;

wherein, a calculation formula of a resultant force on the driving wheel bearing and a resultant force on the driven wheel bearing is expressed as:

$F_1 = 0.75 \Delta p b d_a$ $F_2 = 0.85 \Delta p b d_a$ $F_1$ represents the resultant force acting on the drive wheel bearing, in N;

$F_2$ represents the resultant force acting on the driven wheel bearing, in N;

$\Delta p$ represents a pressure difference between an outlet and an inlet of the gear pump, in Pa;

b represents a tooth width of the gear pump, in in;

$d_a$ represents a diameter of an addendum circle of the gear pump, in m;

S22, calculating an equivalent dynamic load on the rolling bearing, the equivalent dynamic load on the rolling bearing being expressed as:

$P = \sqrt{P^2_r + P^2_a}$ in which, $P_r$ represents a radial force on the rolling bearing, $P_a$ represents an axial force on the rolling bearing;

S23, calculating the life of the rolling bearing, the life calculation formula of the rolling bearings being expressed as:

$$L_h = \frac{10^6}{60n}\left(\frac{C}{P}\right)^\varepsilon$$

in which, $L_h$ represents a rated life of the rolling bearing, in hours;

n represents a working speed of the rolling bearing, in r/min;

C represents a basic rated dynamic load of the rolling bearing, in N;

P represents an equivalent rated dynamic load of the rolling bearing, in N;

$\varepsilon$ represents a calculation coefficient of the bearing, for the rolling bearing, $\varepsilon = 10/3$.

\* \* \* \* \*